(12) United States Patent
Gu et al.

(10) Patent No.: US 10,461,757 B2
(45) Date of Patent: Oct. 29, 2019

(54) REFERENCE-LESS FREQUENCY DETECTOR WITH HIGH JITTER TOLERANCE

(71) Applicant: Futurewei Technologies, Inc., Plano, TX (US)

(72) Inventors: Liang Gu, San Jose, CA (US); Yuming Cao, Pleasanton, CA (US); Gong Lei, Sunnyvale, CA (US); Yen Dang, San Jose, CA (US); Yifan Gu, Santa Clara, CA (US); Hungyi Lee, Cupertino, CA (US); Mamatha Deshpande, San Jose, CA (US); Shou-Po Shih, Cupertino, CA (US); Yan Duan, Ames, IA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/394,364

(22) Filed: Dec. 29, 2016

(65) Prior Publication Data
US 2017/0126236 A1 May 4, 2017

Related U.S. Application Data

(62) Division of application No. 14/925,716, filed on Oct. 28, 2015, now Pat. No. 9,584,303.

(51) Int. Cl.
*H03K 5/14* (2014.01)
*H03L 7/099* (2006.01)
(Continued)

(52) U.S. Cl.
CPC .............. *H03L 7/099* (2013.01); *H03D 13/00* (2013.01); *H03K 5/135* (2013.01); *H03K 5/14* (2013.01);
(Continued)

(58) Field of Classification Search
CPC .......... G01R 23/02; G01R 25/00; H03B 5/18; H03D 3/24; H03K 3/00; H03K 5/153;
(Continued)

(56) References Cited

U.S. PATENT DOCUMENTS

| 6,255,911 B1 | 7/2001 | Niwa et al. |
| 6,498,537 B1 | 12/2002 | Watanabe |

(Continued)

FOREIGN PATENT DOCUMENTS

| EP | 0758171 A2 | 2/1997 |
| KR | 2007044667 A | 4/2007 |
| WO | 2014196890 A1 | 12/2014 |

OTHER PUBLICATIONS

Foreign Communication From a Counterpart Application, PCT Application No. PCT/CN2015/096173, International Search Report dated Jul. 21, 2016, 7 pages.

(Continued)

*Primary Examiner* — Shawkat M Ali
(74) *Attorney, Agent, or Firm* — Conley Rose, P.C.

(57) ABSTRACT

An apparatus, comprising a first sampling circuit configured to sample a clock signal according to a data signal to produce a first sampled signal, a second sampling circuit configured to sample the clock signal according to a delay signal to produce a second sampled signal, and a control circuit coupled to the first sampling circuit and the second sampling circuit, wherein the control circuit is configured to perform a not-and (NAND) operation according to the first sampled signal and the second sampled signal to produce an activation signal for activating a frequency adjustment for the clock signal.

22 Claims, 11 Drawing Sheets

(51) Int. Cl.
 *H04L 7/00*     (2006.01)
 *H03D 13/00*    (2006.01)
 *H04L 7/033*    (2006.01)
 *H03K 5/135*    (2006.01)
 *H03K 19/0948*   (2006.01)
 *H03K 19/20*    (2006.01)
 *H03L 7/08*     (2006.01)
 *H03L 7/085*    (2006.01)
 *H03L 7/089*    (2006.01)
 *H03K 5/00*    (2006.01)

(52) U.S. Cl.
 CPC ......... *H03K 19/0948* (2013.01); *H03K 19/20* (2013.01); *H03L 7/085* (2013.01); *H03L 7/0807* (2013.01); *H03L 7/089* (2013.01); *H04L 7/0008* (2013.01); *H04L 7/0016* (2013.01); *H04L 7/033* (2013.01); *H03K 2005/00078* (2013.01)

(58) Field of Classification Search
 CPC .... H03K 7/08; H03L 7/00; H03L 7/06; H03L 7/085; H03L 7/18
 USPC ......... 327/3, 12, 47, 49, 147, 156, 157, 199, 327/294; 331/14, 17, 23, 25; 375/334, 375/354, 355, 371, 373, 375
 See application file for complete search history.

(56) References Cited

U.S. PATENT DOCUMENTS

| | | | |
|---|---|---|---|
| 6,590,427 B2 | 7/2003 | Murphy et al. | |
| 6,828,865 B2 | 12/2004 | Yamane et al. | |
| 7,015,727 B2 | 3/2006 | Balasubramanian | |
| 7,061,289 B1* | 6/2006 | Broughton | H03L 7/0891 327/148 |
| 7,447,290 B2 | 11/2008 | Hsiao | |
| 7,508,245 B2 | 3/2009 | Kim et al. | |
| 7,728,631 B2 | 6/2010 | Nathawad | |
| 8,519,756 B2 | 8/2013 | Wang et al. | |
| 2004/0095108 A1* | 5/2004 | Kernahan | H03K 19/0963 323/282 |
| 2005/0280458 A1* | 12/2005 | Leung | H02M 3/33576 327/172 |
| 2006/0250192 A1 | 11/2006 | Hsieh | |
| 2007/0018705 A1 | 1/2007 | Riley | |
| 2008/0055007 A1 | 3/2008 | Biedka | |
| 2008/0231324 A1 | 9/2008 | Liu et al. | |
| 2008/0246516 A1 | 10/2008 | Hoang et al. | |
| 2009/0278618 A1 | 11/2009 | Lipan | |
| 2010/0002822 A1 | 1/2010 | Arima et al. | |
| 2014/0097879 A1 | 4/2014 | Wang et al. | |

OTHER PUBLICATIONS

Foreign Communication From a Counterpart Application, PCT Application No. PCT/CN2015/096173, Written Opinion dated Jul. 21, 2016, 4 pages.

Lee, et al., "A 20-Gb/s Full-Rate Linear Clock and Data Recovery Circuit With Automatic Frequency Acquisition," IEEE Journal of Solid-State Circuits, vol. 44, No. 12, Dec. 2009, pp. 3590-3602.

Office Action dated Feb. 10, 2016, 6 pages, U.S. Appl. No. 14/925,716, filed Oct. 28, 2015.

Office Action dated Apr. 28, 2016, 2016, 12 pages, U.S. Appl. No. 14/925,716, filed Oct. 28, 2015.

Notice of Allowance dated Sep. 14, 2016, 2016, 15 pages, U.S. Appl. No. 14/925,716, filed Oct. 28, 2015.

\* cited by examiner

REFERENCE-LESS FREQUENCY DETECTOR WITH HIGH JITTER TOLERANCE

CROSS-REFERENCE TO RELATED APPLICATIONS

This application is a divisional application of U.S. patent application Ser. No. 14/925,716 filed on Oct. 28, 2015 by Liang Gu, et al., and titled "Reference-less Frequency Detector With High Jitter Tolerance," which is incorporated by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Data transmitted across a high-speed system, such as between two chips on a highly, integrated system or between circuits within a single chip, are typically sent without an accompanying clock signal. Although clock-less data transmission reduces complexity and power consumption, the receiver of the data is required to generate a clock signal to recover the data. The receiver may employ a clock and data recovery (CDR) circuit to generate a clock signal in synchronization with the phase and frequency of the received data. Accurate detection of the phase and frequency of the received data or the phase and frequency offsets between the clock signal and the data signal is therefore important to ensure high quality data communication, especially for high-speed data systems that operate at about 10 gigabits per second (Gbps) to about 100 Gbps.

SUMMARY

In one embodiment, the disclosure includes an apparatus, comprising a first sampling circuit configured to sample a clock signal according to a data signal to produce a first sampled signal, a second sampling circuit configured to sample the clock signal according to a delayed data signal to produce a second sampled signal, and a control circuit coupled to the first sampling circuit and the second sampling circuit, wherein the control circuit is configured to perform a not-and (NAND) operation according to the first sampled signal and the second sampled signal to produce an activation signal for activating a frequency adjustment for the clock signal.

In another embodiment, the disclosure includes a method comprising sampling a clock signal according to a data signal to produce a first sampled signal, delaying the data signal by a quarter of a bit duration to produce a delayed signal, sampling the clock signal according to the delayed signal to produce a second sampled signal, and performing a NAND operation according to the first sampled signal and the second sampled signal to produce an activation signal for activating a charge pump to align a frequency of the clock signal to a frequency of the data signal.

In yet another embodiment, the disclosure includes an apparatus comprising a NAND gate comprising a first NAND gate input port, a second NAND gate input port, and a NAND gate output port, and a voltage-to-current (V2I) converter comprising a V2I converter activation port and a V2I converter output current port, wherein the V2I converter activation port is coupled to the NAND gate output, and wherein the V2I converter output current port is coupled to a frequency detection loop filter.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although illustrative implementations of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Frequency detectors are commonly employed in phase-locked loop (PLL)-based CDRs to recover timing information from data. A reference-less frequency detector refers to a frequency detector comprising a frequency detection loop that is automatically activated when the loop is out of lock and automatically deactivated after completing frequency acquisition without the employment of a reference clock or a lock detector. The elimination of the reference clock and the lock detector reduces the number of hardware components and power consumption. Thus, reference-less frequency detectors may provide an attractive solution for CDRs.

Figure 1:
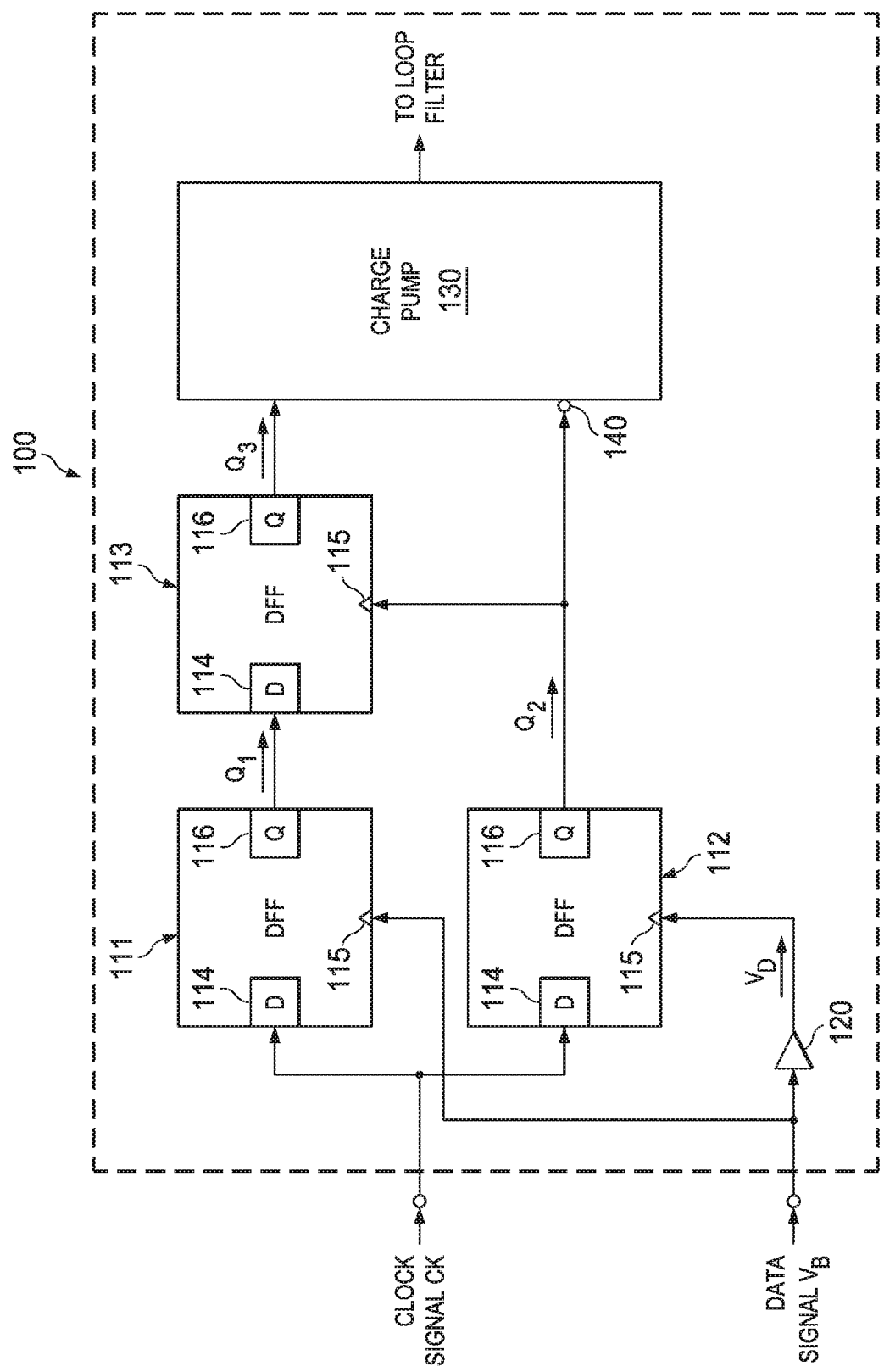
FIG. 1 is a schematic diagram of a reference-less frequency detector.

FIG. 1 is a schematic diagram of a reference-less frequency detector 100. The frequency detector 100 comprises three D-type flip-flops (DFFs) 111, 112, and 113, a delay buffer 120, and a charge pump 130. The DFFs 111, 112, and 113 comprise data input ports 114 shown as D, clock input ports 115, and output ports 116 shown as Q. Each DFF 111, 112 further comprises circuits configured to sample a digital clock signal at the data input port 114 by a data signal at the clock input port 115 and output the sampled signal at the output port 116. The DFF 113 further comprises circuits configured to sample an output signal of the DFF 111 at the data input port 114 by an output signal of the DFF 112 at the clock input port 115 and output the sampled signal at the output port 116. The sampling may be performed at a rising edge or a falling edge of a clock cycle. The delay buffer 120 comprises circuits configured to delay an input signal by a period of time such as about a quarter of a bit duration. The charge pump 130 comprises circuits configured to control current flow in a loop filter. For example, the charge pump 130 may be a V2I converter comprising current sources that drive current to or from the loop filter.

The frequency detector 100 receives a data signal $V_B$ and a clock signal CK as inputs. The clock signal CK is generated by a voltage controlled oscillator (VCO). The clock signal CK is provided to the DFFs 111 and 112 at corresponding data input ports 114. The data signal $V_B$ is provided to the DFF 111 at the DFF 111's clock input port 115. The data signal is delayed by the delay buffer 120 by about a quarter of a bit to produce a delayed signal $V_D$, which is provided to the DFF 112 at DFF 112's clock input port 115. The DFF 111 samples the clock signal CK at a rising edge of the data signal $V_B$ and outputs the sampled output signal $Q_1$ at the DFF 111's output port 116. Similarly, the DFF 112 samples the clock signal CK at a rising edge of the delay signal $V_D$ and outputs the sampled output signal $Q_2$ at the DFF 112's output port 116. The output signals $Q_1$ and $Q_2$ comprise equal periods, which may be proportional or inversely proportional to the frequency difference between the data signal $V_B$ and the clock signal CK. The relative phase shift between the output signals $Q_1$ and $Q_2$ indicates the polarity of the frequency difference. When the output signal $Q_1$ leads the output signal $Q_2$, the frequency of the clock signal CK is less than the frequency of the data signal $V_B$. When the output signal $Q_1$ lags the output signal $Q_2$, the frequency of the clock signal CK is greater than the frequency of the data signal $V_B$.

The DFF 113 is coupled to the output ports 116 of the DFFs 111 and 112. The DFF 113 receives the output signal $Q_1$ at the DFF 113's data input port 114 and the output signal $Q_2$ at the DFF 113's clock input port 115. The DFF 113 samples the output signal $Q_1$ by the output signal $Q_2$. When the output signal $Q_1$ leads the output signal $Q_2$, the DFF 113 produces an output signal $Q_3$ with a logic high level. When the output signal $Q_1$ lags the output signal $Q_2$, the DFF 113 generates an output signal $Q_3$ with a logic low level. The logic high level represents a binary value of one, and the logic low level represents a binary value of zero. The voltage levels of the logic high level and the logic low level depend on the power supply voltage employed by the frequency detector 100. Since the output signal $Q_3$ carries the polarity of the frequency difference between the data signal $V_B$ and the clock signal CK, the output signal $Q_3$ may be used to instruct the charge pump 130 to charge or discharge the loop filter. The output voltage of the loop filter increases or decreases as the loop filter is charged or discharged. Therefore, the output voltage of the loop filter may be used to control the VCO, where the frequency of the clock signal CK is proportional to the output voltage. For example, the charge pump 130 is configured to charge the loop filter when the output signal $Q_3$ is high and discharge the loop filter when the output signal $Q_3$ is low. The charging or discharging of the loop filter is required to be deactivated when the frequency of the clock signal CK is locked to the frequency of the data signal $V_B$. As shown, the output signal $Q_2$ is employed to control the activation and deactivation of the charge pump 130. The activation of the charge pump 130 is active low, thus the inverse of the output signal $Q_2$ is used to activate and deactivate the charge pump 130 as shown by the bubble 140. After the clock signal CK is corrected to match the frequency of the data signal $V_B$, the clock signal CK may be used to re-time or sample the data signal $V_B$ or a copy of the data signal $V_B$ for data recovery, as described more fully below.

Figure 2:
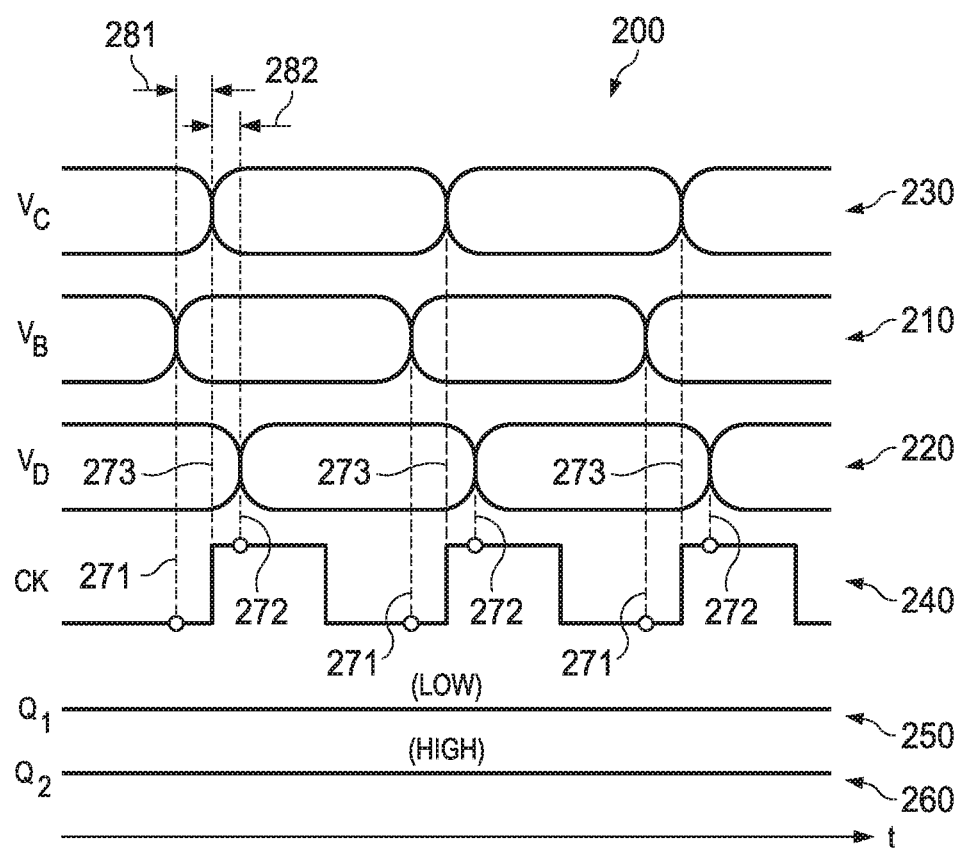
FIG. 2 is a graph illustrating simulated waveforms of the reference-less frequency detector of FIG. 1 under a lock condition.

FIG. 2 is a graph 200 illustrating simulated waveforms of the reference-less frequency detector 100 under a lock condition. A lock condition refers to the condition when the frequency of a clock signal used for sampling an incoming data signal is about equal to the frequency of the incoming data signal. In the graph 200, the x-axis represents time in some constant units, and the y-axis represents voltages in some constant units. The waveform $V_B$ 210 corresponds to data signal $V_B$ in the frequency detector 100. The waveform $V_D$ 220 corresponds to the delay signal $V_D$ in the frequency detector 100. The waveform $V_C$ 230 corresponds to the data signal $V_B$ with a delay of about one-eighth of a bit duration. The waveform CK 240 corresponds to the clock signal CK in the frequency detector 100. The waveform $Q_1$ 250 corresponds to the DFF 111's output signal $Q_1$ in the frequency detector 100. The waveform $Q_2$ 260 corresponds to the DFF 112's output signal $Q_2$ in the frequency detector 100. As shown, when the frequency of the clock signal CK is locked to the frequency of the data signal $V_B$, bit transitions in the data signal $V_B$ always occur while the clock signal CK is low as shown by the dotted line 271, whereas bit transitions in the data signal $V_D$ always occur while the clock signal CK is high as shown by the dotted line 272. As such, the signal $Q_1$ stays at a constant logic low level and the signal $Q_2$ stays at a constant logic high level under a lock condition. Thus, the signals $Q_1$ and $Q_2$ comprise a logic state of 01 under the lock condition. In addition, the rising edges of the waveform CK 240 are aligned to the bit transitions in the waveform $V_C$ 230 as shown by the dotted line 273. Thus, the original data bits may be recovered by sampling the signal of the waveform $V_C$ 230 by the falling edges of the clock signal CK.

However, if jitter occurs for the signals $V_B$ and $V_D$, the rising edges of the clock signal CK may momentarily drift to the right or to the left. Jitter may occur due to various reasons, such as noise on a transmission line, inter-symbol interference (ISI) in a received data stream, and noise in the original transmitted source data stream. When the drift exceeds the timing margin 281 or 282, the drift may cause both signals $V_B$ and $V_D$ to transition when the clock signal CK is low or when the clock signal CK is high, and thus may toggle the signals $Q_1$ and $Q_2$. The toggling changes the logic state of signals $Q_1$ and $Q_2$, causing the frequency detector 100 to falsely detect a loss of lock and unnecessarily correct the frequency of the clock signal CK.

Figure 3:
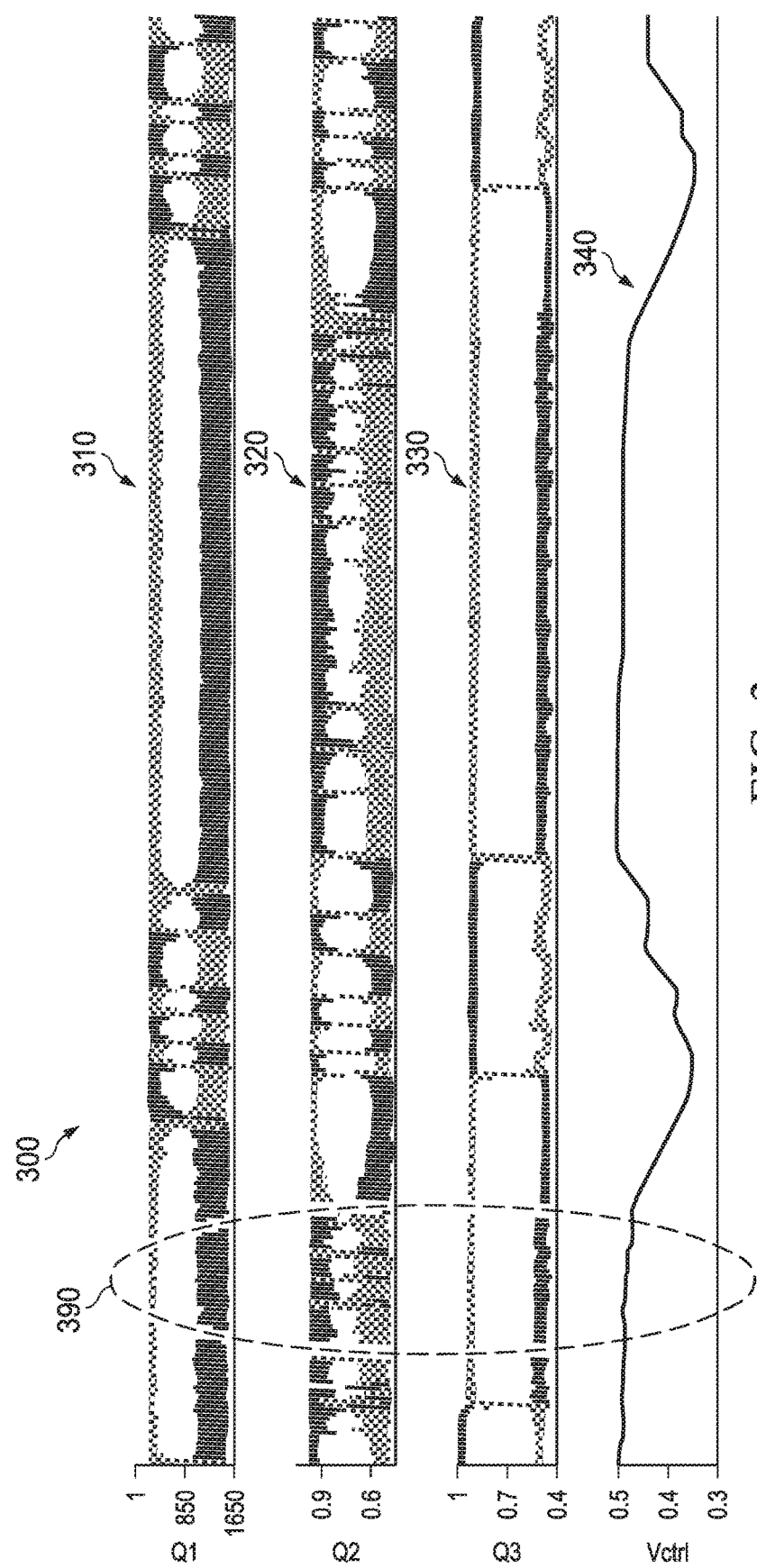
FIG. 3 is a graph illustrating captured waveforms of the reference-less frequency detector of FIG. 1 under jitter.

FIG. 3 is a graph 300 illustrating captured waveforms of the reference-less frequency detector 100 under jitter. In the graph 300, the x-axis represents time in some constant units, and the y-axis represents signal amplitude in units of voltages. The waveform $Q_1$ 310 corresponds to the output signal $Q_1$ in the frequency detector 100. The waveform $Q_2$ 320 corresponds to the output signal $Q_2$ in the frequency detector 100. The waveform $Q_3$ 330 corresponds to the output signal $Q_3$ in the frequency detector 100. The signals $Q_1$, $Q_2$, and $Q_3$ are differential signals, each comprising a pair of positive and negative signals that are equal in amplitude and opposite in polarity. The solid curves correspond to the positive signals and the dotted curves correspond to the negative signals. The waveform $V_{CTRL}$ 340 corresponds to the control voltage generated by a loop filter that is driven by the charge pump 130. The control voltage is used to drive a VCO that generates the clock signal CK in the frequency detector 100. The region 390 corresponds to a time period in which jitter is present. As shown, the positive signals and the negative signals in the waveforms $Q_2$ 320 toggle in the presence of the jitter, causing the signals $Q_1$ and $Q_2$ to transition from the lock state of 01 into a state 00 or a state 11. When signals $Q_1$ and $Q_2$ momentarily transition into the state 11, the charge pump 130 remains inactivated since signal $Q_2$ remains high and the charge pump 130 is active low as described above. However, when signals $Q_1$ and $Q_2$ momentarily transition into the state 00, the charge pump 130 is falsely activated since signal $Q_2$ is low, thus causing the loop filter to unnecessarily change the control voltage as shown in the waveform $V_{CTRL}$ 340. The variations in the driving voltage cause VCO instability, and thus the VCO's frequency is no longer locked to the incoming data frequency.

Figure 4:
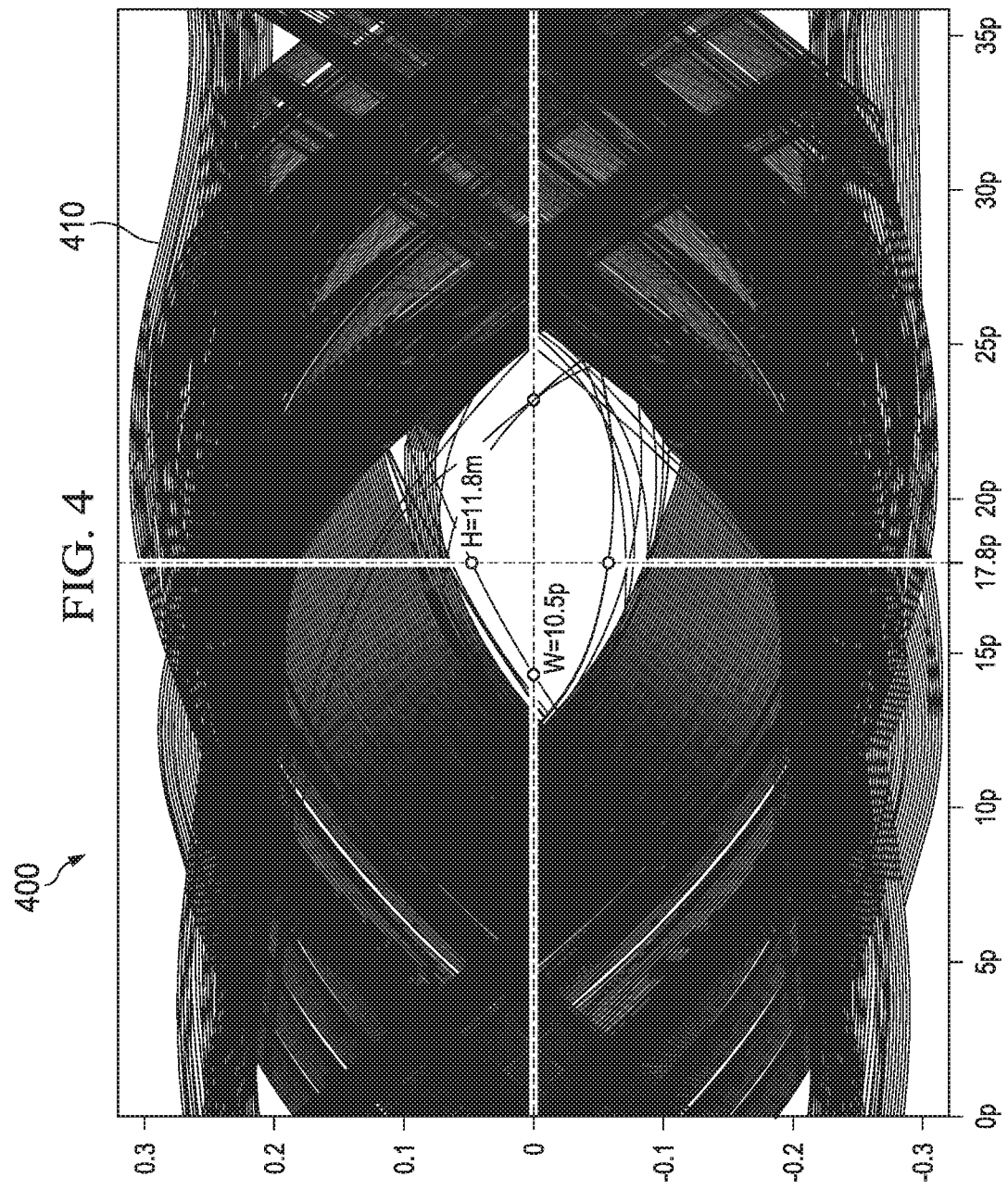
FIG. 4 is a graph illustrating a captured eye diagram of the reference-less frequency detector of FIG. 1 while experiencing jitter.

FIG. 4 is a graph 400 illustrating a captured eye diagram 410 of the reference-less frequency detector 100 while experiencing jitter. The x-axis represents time in some constant units, and the y-axis represents signal amplitude in some constant units. The eye diagram 410 corresponds to a data signal re-timed by the frequency detector 100. A re-timed data signal refers to the sampling of a copy of an original incoming data signal by a clock signal that is adjusted by a frequency detector such as the frequency detector 100. As shown, the eye diagram 410 is almost closed due to the jitter, and thus the data bits may not be recovered correctly from the re-timed data signal.

Disclosed herein are embodiments for providing a reference-less frequency detector with high jitter tolerance. The disclosed embodiments employ a reference-less frequency detector comprising three sampling circuits. A first sampling circuit samples a clock signal generated by a VCO according to an incoming data signal to produce a first output signal $Q_1$. The second sampling circuit samples the clock signal according to a delayed copy of the incoming data signal to produce a second output signal $Q_2$, where the delay is about a quarter of a bit duration. The third sampling circuit samples the first output signal by the second output signal to produce a third output signal. The third output signal instructs a charge pump to control the current flow of a loop filter for aligning the frequency of the VCO to the frequency of the incoming data signal. However, instead of directly activating the charge pump based on signal $Q_2$ as in the frequency detector 100, the disclosed embodiments activate the charge pump only when signal $Q_1$ is at a logic high level and signal $Q_2$ is at a logic low level. The disclosed embodiments enforce the activation condition by inserting a NAND gate at the input of the charge pump with signals $Q_1$ and $Q_2$ as inputs. In an embodiment, the first, second, and third sampling circuits are implemented by DFFs comprising CML logic circuits and the NAND gate is implemented by CMOS logic circuits. Thus, CML-to-CMOS level converters are employed to convert the first output signal $Q_1$ and the second output signal $Q_2$ from CML differential signals to CMOS rail-to-rail signals before applying them to the inputs of the NAND gate. The employment of the NAND gate prevents the frequency detector from falsely triggering the VCO frequency correction under high jitter. The disclosed frequency detector is suitable for use in high-speed systems such as optical modules operating at about 10 Gbps to about 100 Gbps.

Figure 5:
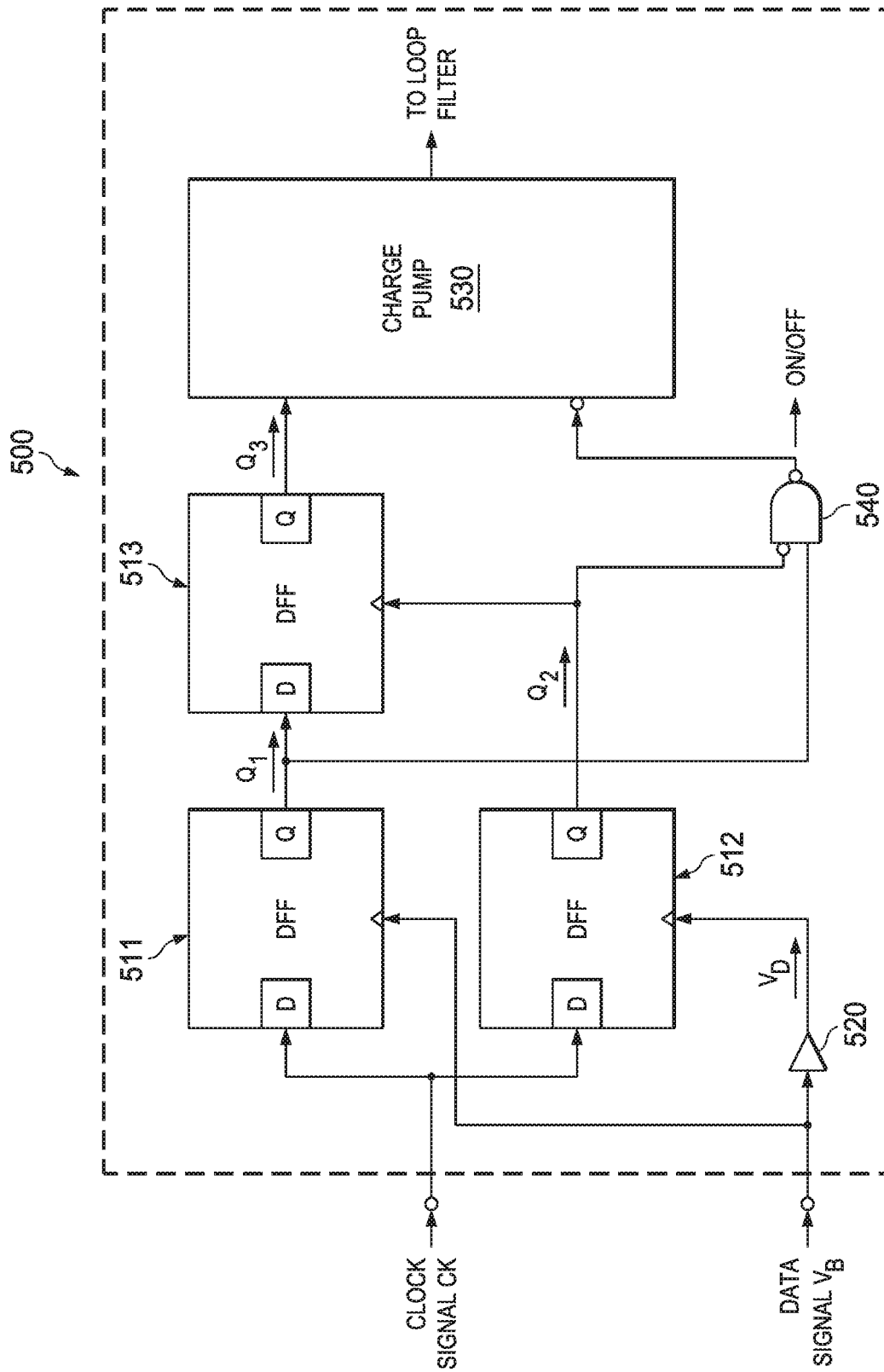
FIG. 5 is a schematic diagram of a jitter-tolerant, reference-less frequency detector according to an embodiment of the disclosure.

FIG. 5 is a schematic diagram of a jitter-tolerant, reference-less frequency detector 500 according to an embodiment of the disclosure. The frequency detector 500 employs logic components to prevent the frequency detector 500 from over-driving a VCO and unnecessarily correcting the frequency of the VCO under jitter. The frequency detector 500 comprises three DFFs 511, 512, and 513, a delay buffer 520, a charge pump 530, and a NAND gate 540. The DFFs 511, 512, and 513 are similar to the DFFs 111, 112, and 113. The delay buffer 520 is similar to the delay buffer 120. The charge pump 530 is similar to the charge pump 130. The DFF 511 samples a clock signal CK by a data signal $V_B$ to produce a first output signal $Q_1$, where the clock signal CK is generated by a local VCO. The delay buffer 520 delays the data signal $V_B$ by about a quarter of a bit duration to produce a delayed signal $V_D$. The DFF 512 samples the clock signal CK by the delayed signal $V_D$ to produce a second output signal $Q_2$.

To prevent jitter from falsely activating the charge pump 530 when the frequency of the VCO is locked to the frequency of the data signal $V_B$, the frequency detector 500 employs the NAND gate 540 to enforce the activation condition to be only when the first output signal $Q_1$ is high and the second output signal $Q_2$ is low. The NAND gate 540 is coupled to the DFFs 511 and 512 and configured to receive the first output signal $Q_1$ and an inverse of the second output signal $Q_2$ as inputs. The NAND gate 540 performs a NAND operation on the first output signal $Q_1$ and the inverse of the second output signal $Q_2$. The following table summarizes the logic of the NAND gate 540:

TABLE 1

Logic of the NAND Gate 540

| Inputs to NAND Gate 540 | | | | Output of NAND Gate 540 |
|---|---|---|---|---|
| $Q_1$ | $Q_2$ | $Q_1$ | Invert($Q_2$) | |
| 0 | 0 | 0 | 1 | 1 |
| 0 | 1 | 0 | 0 | 1 |
| 1 | 0 | 1 | 1 | 0 |
| 1 | 1 | 1 | 0 | 1 |

As shown in Table 1, the NAND gate 540 produces an output with a logic low level only when signals $Q_1$ and $Q_2$ comprise a logic state of 10. Since the charge pump 530 is active low, the output signal of the NAND gate 540, shown as ON/OFF, is inverted prior to applying the signal ON/OFF to activate the charge pump 530.

The DFF 513 samples signals $Q_1$ by $Q_2$ to produce an error signal $Q_3$ indicating the polarity of the frequency difference between the data signal $V_B$ and the clock signal CK. The error signal $Q_3$ drives the charge pump 530 to charge or discharge a loop filter, which produces a control voltage for adjusting the frequency of the VCO to match the frequency of the data signal $V_B$. The frequency detector 500 may be configured to employ the DFFs 511, 512, and 513 for frequency comparison as shown or alternatively configured to employ other suitable logic circuits to achieve similar functionalities.

Figure 6:
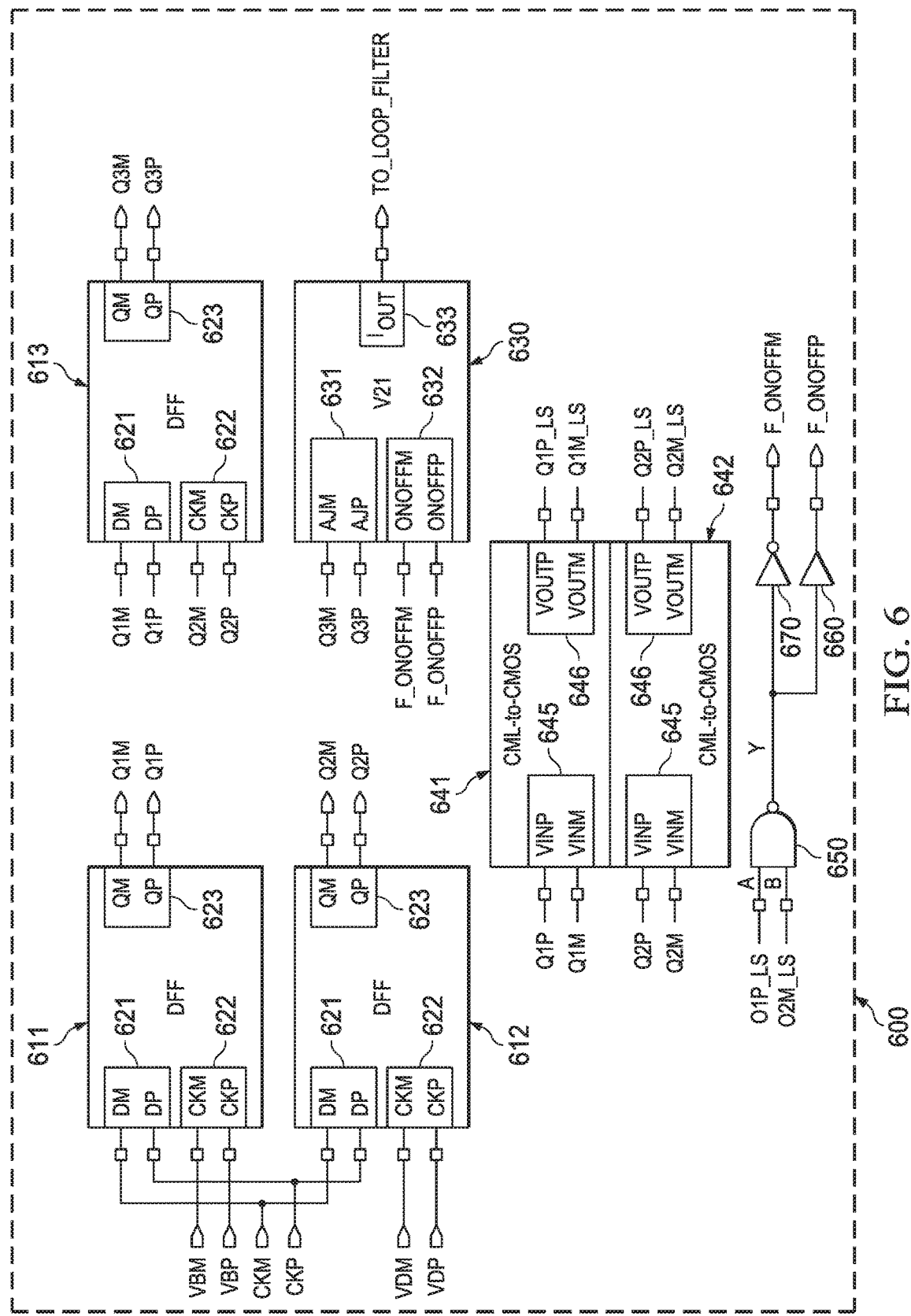
FIG. 6 is a schematic diagram of a scheme for implementing a jitter-tolerant, reference-less frequency detector according to an embodiment of the disclosure.

FIG. 6 is a schematic diagram of a scheme 600 for implementing a jitter-tolerant, reference-less frequency detector such as the frequency detector 500 according to an embodiment of the disclosure. The scheme 600 employs three DFF modules 611, 612, and 613, a V2I module 630, two CML-to-CMOS modules 641 and 642, a NAND module 650, a buffer module 660, and an inverter module 670 to implement the frequency detector 500. The scheme 600 employs differential circuits and represents the positive and the negative signal components of a differential pair by a letter P and a letter M, respectively. The negative signal component is an inverse of the positive signal component. The scheme 600 operates on a differential pair of data signals VBM and VBP, a differential pair of delayed signals VDM and VDP, and a differential pair of clock signals VCO_CKM and VCO_CKP. The data signals VBM and VBP correspond to the input data signal $V_B$ at the frequency detector 500. The delayed signals VDM and VDP correspond to the delayed signal $V_D$ delayed from the data signal $V_B$ by about a quarter of a bit. The clock signals CKM and CKP correspond to the clock signal CK generated by a VCO controlled by the frequency detector 500.

The DFF modules 611, 612, and 613 may comprise CML circuits configured to implement the sampling functions of the DFFs 511, 512, and 513. Each of the DFF modules 611, 612, and 613 further comprises a differential data input port 621 comprising terminals DM and DP, a differential clock input port 622 comprising terminals CKM and CKP, and a differential output port 623 comprising terminals QM and QP. The data input ports 621, the clock input ports 622, and the output ports 623 are similar to the data input ports 114, the clock input ports 115, and the output ports 116, respectively, and provide a more detailed view of the differential terminals. The DFF modules 611, 612, and 613 are referred to as sampling circuits. The V2I module 630, the NAND module 650, the buffer module 660, the inverter module 670, and the CML-to-CMOS modules 641 and 642 are referred to as control circuits.

The DFF modules 611, 612, and 613 are configured to couple with each other in a similar configuration as the DFFs 511, 512, and 513 in the frequency detector 500. The data input ports 621 of the DFF modules 611 and 612 are configured to connect to the differential pair of clock signals VCO_CKM and VCO_CKP. The clock input port 622 of the DFF module 611 is configured to connect to the differential pair of data signals VBM and VBP. The clock input port 622 of the DFF module 612 is configured to connect to the differential pair of delayed signals VDM and VDP. The output port 623 of the DFF module 611 produces a differential pair of output signals Q1M and Q1P, which are coupled to the data input ports 621 of the DFF module 613. The output port 623 of the DFF module 612 produces a differential pair of output signals Q2M and Q2P, which are coupled to the clock input ports 622 of the DFF module 613. The output ports 623 of the DFF module 613 produces a differential pair of output signals Q3M and Q3P.

The CML-to-CMOS modules 641 and 642 comprise circuits configured to convert signals from CML voltage levels to CMOS logic voltage levels. For example, CMLs may comprise a lower output voltage swing than CMOS logics. Each of the CML-to-CMOS modules 641 and 642 further comprises a differential input port 645 comprising terminals VIN_M and VIN_P, and a differential output port 646 comprising terminals VOUT_M and VOUT_P. The input port 645 receives CML differential signals, and the output port 646 produces CMOS rail-to-rail signals converted from the received CML differential signals. The internal circuits of the CML-to-CMOS modules 641 and 642 are described more fully below. The input port 645 of the CML-to-CMOS module 641 is configured to receive the signals Q1M and Q1P from the DFF module 611 and produce level-shifted signals Q1P_LS and Q1M_LS at the output port 646. The input port 645 of the CML-to-CMOS module 642 is configured to receive the signals Q2M and Q2P from the DFF module 612 and produce level-shifted signals Q2P_LS and Q2M_LS. As shown, the connections between the DFF modules 611, 612, and 613 and the CML-to-CMOS modules 641 and 642 are configured such that positive signal components are connected to positive terminals and negative signal components are connected to negative terminals.

The NAND module 650 comprises circuits configured to implement the NAND operation of the NAND gate 540. The buffer module 660 comprises circuits configured to buffer or delay a signal by a period of time, which may be in units of clock cycles. The inverter module 670 comprises circuits configured to invert the polarity of a signal. The NAND module 650 is coupled to the CML-to-CMOS modules 641 and 642 and configured to receive the signals Q1P_LS and Q2M_LS as inputs A and B and produce a NAND of the signals Q1P_LS and Q2M_LS as output Y. The input states and the output states of the NAND module 650 are as shown in Table 1. The inverter module 670 and the buffer module 660 are coupled to the output of the NAND module 650. The inverter module 670 comprises circuits configured to invert the output signal of the NAND module 650 to produce an output signal FONOFF_M. The buffer module 660 comprises circuits configured to buffer the output signal of the NAND module 650 for a period of time, which may be similar to the delay of the inverter module 670. The buffer module 660 produces an output signal FONOFF_P. The output signals FONOFF_M and FONOFF_P are configured to form a differential pair to activate or deactivate the V2I module 630.

The V2I module 630 comprises current sources configured to convert voltages to current. The V2I module 630 further comprises a differential signal adjustment port 631 comprising terminals ADJM and ADJP, a differential activation port 632 comprising terminals ONOFFM and ONOFFP, and an output current port 633, shown as IOUT. The signal adjustment port 631 is configured to receive the output signals Q3M and Q3P from the output port 623 of the DFF module 613. The activation port 632 is configured to receive the output signals ONOFFM and ONOFFP from the outputs of the inverter module 670 and the buffer module 660, respectively. The V2I module 630 produces a current signal at the output port 633 when the ONOFFP signal is at a logic high level, where the amount of current is dependent on the signals Q3M and Q3P. The current signal is employed to drive current to and from a loop filter for controlling the frequency of the VCO.

Figure 7:
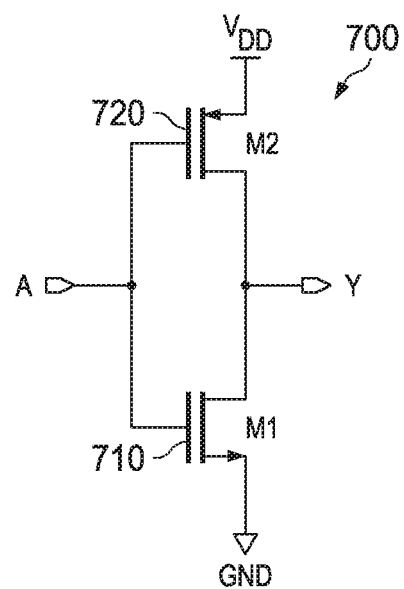
FIG. 7 is a schematic diagram of an inverter circuit according to an embodiment of the disclosure.

FIG. 7 is a schematic diagram of an inverter circuit 700 according to an embodiment of the disclosure. The inverter module 670 may employ the circuit 700 to implement a signal inversion function. The circuit 700 comprises an n-channel metal-oxide semiconductor (NMOS) transistor 710, shown as M1, and a p-channel metal-oxide semiconductor (PMOS) transistor 720, shown as M2. The NMOS transistor 710 and the PMOS transistor 720 are connected to each other at their drains and gates. The source of the NMOS transistor 710 is connected to ground, shown as GND. The source of the PMOS transistor 720 is connected to a power supply voltage, shown as $V_{DD}$. The input of the inverter 700, shown as A, is connected to the gates of the NMOS transistor 710 and the PMOS transistor 720. The output of the inverter circuit 700, shown as Y, is connected to the drains of the NMOS transistor 710 and the PMOS transistor 720. When the input A is low, the NMOS transistor 710 is turned off and the PMOS transistor 720 is turned on, providing a connection path between the output Y and the $V_{DD}$ rail. Thus, the output Y is at a logic high level. When the input A is high, the NMOS transistor 710 is turned on and the PMOS transistor 720 is turned off, providing a connection path between the output Y and GND. Thus, the output Y is at a logic low level.

Figure 8:
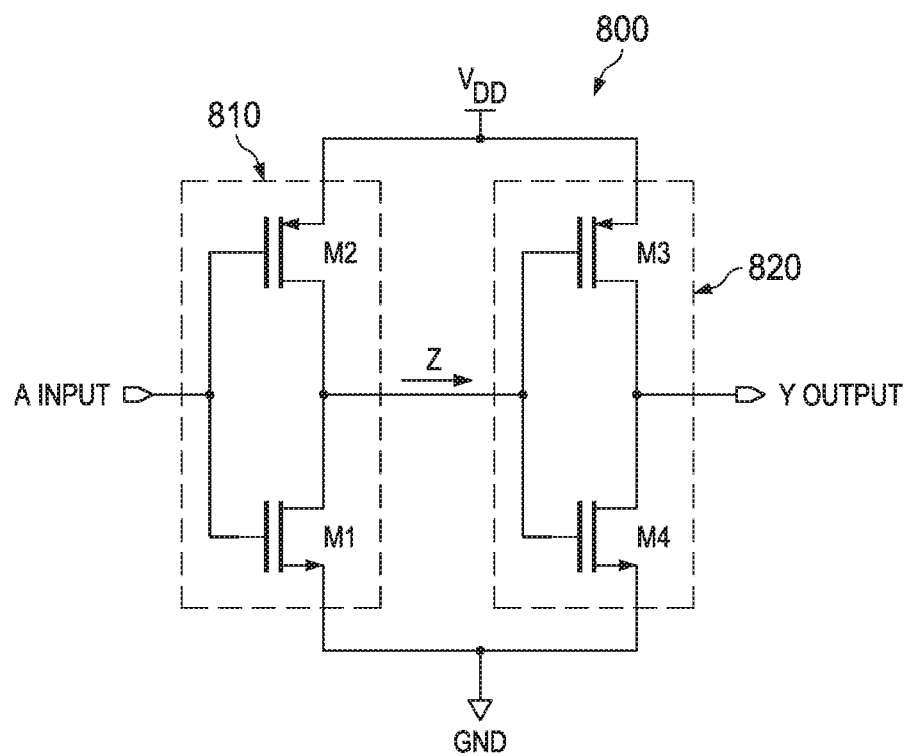
FIG. 8 is a schematic diagram of a buffer circuit according to an embodiment of the disclosure.

FIG. 8 is a schematic diagram of a buffer circuit 800 according to an embodiment of the disclosure. The buffer module 660 may employ the circuit 800 to implement a buffering function. The circuit 800 comprises two inverter circuits 810 and 820 similar to the inverter circuit 700. The inverter circuit 810 receives an input signal A and produces an inverse of the input signal A, shown as Z. The inverter circuit 820 receives the inverted signal Z and produces an inverse of the signal Z, shown as Y. Thus, the circuit 800 outputs a delayed copy of the input signal A.

Figure 9:
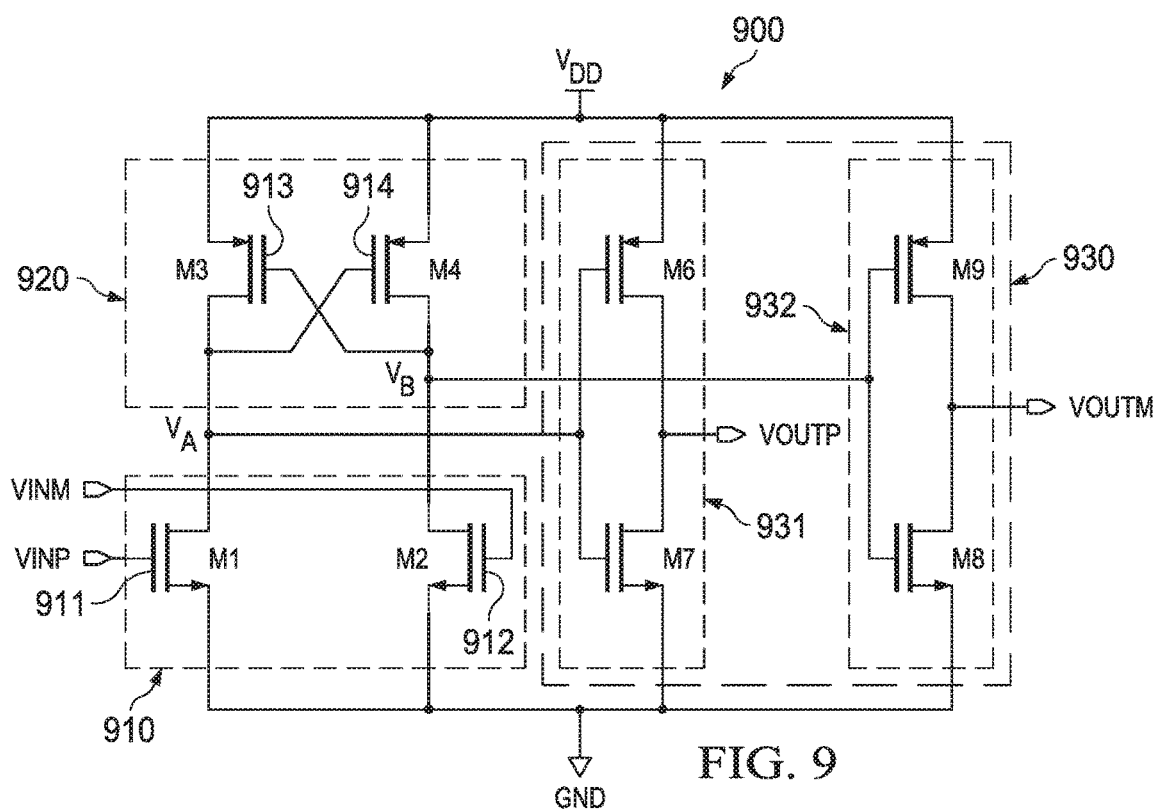
FIG. 9 is a schematic diagram of a current-mode logic-to-complementary metal-oxide semiconductor (CML-to-CMOS) level conversion circuit according to an embodiment of the disclosure.

FIG. 9 is a schematic diagram of a CML-to-CMOS level conversion circuit 900 according to an embodiment of the disclosure. The CML-to-CMOS modules 641 and 642 may employ the circuit 900 to implement a level conversion function. The circuit 900 converts CML voltage levels to CMOS logic voltage levels. The circuit 900 comprises two differential logic sections 910 and 920 and an output section 930. The differential logic section 910 comprises an NMOS transistor 911, shown as M1, and an NMOS transistor 912, shown as M2. The differential logic section 920 comprises a PMOS transistor 913, shown as M3, and a PMOS transistor 914, shown as M4. The gate of the NMOS transistor 911 receives an input voltage VINP, and the gate of the NMOS transistor 912 receives an input voltage VINM. The input voltages VINP and VINM comprise CML voltage levels. The drain of the NMOS transistor 911 is connected to the drain of the PMOS transistor 913 and to the gate of the PMOS transistor 914. The drain of the NMOS transistor 912 is connected to the drain of the PMOS transistor 914 and to the gate of the PMOS transistor 913. The sources of the NMOS transistors 911 and 912 are connected to ground, shown as GND. The sources of the PMOS transistors 913 and 914 are connected to a power supply voltage, shown as $V_{DD}$, which is a CMOS rail voltage. In operation, when VINP is high, VINM is low. Thus, the NMOS transistor 911 is turned on and the NMOS transistor 912 is turned off, which causes $V_A$ to be logic low. The transition of $V_A$ turns the PMOS transistor 914 on, providing a connection path between $V_B$ and the $V_{DD}$ rail. When VINP is low, VINM is high. Thus, the NMOS transistor 911 is turned off and the NMOS transistor 912 is turned on, which causes $V_B$ to be logic low. The transition of $V_B$ turns the PMOS transistor 913 on, providing a connection between $V_A$ and the $V_{DD}$ rail.

The output section 930 comprises two inverter circuits 931 and 932 similar to the inverter circuits 700, 810, and 820. The inverter circuit 931 is coupled to the signal $V_A$ and produces an inverse of the signal $V_A$, shown as VOUTP. The inverter circuit 932 is coupled to the signal $V_B$ and produces an inverse of the signal $V_B$, shown as VOUTM. The signals VOUTP and VOUTB comprise voltage levels with respect to $V_{DD}$ and GND, which are CMOS voltage levels.

Figure 10:
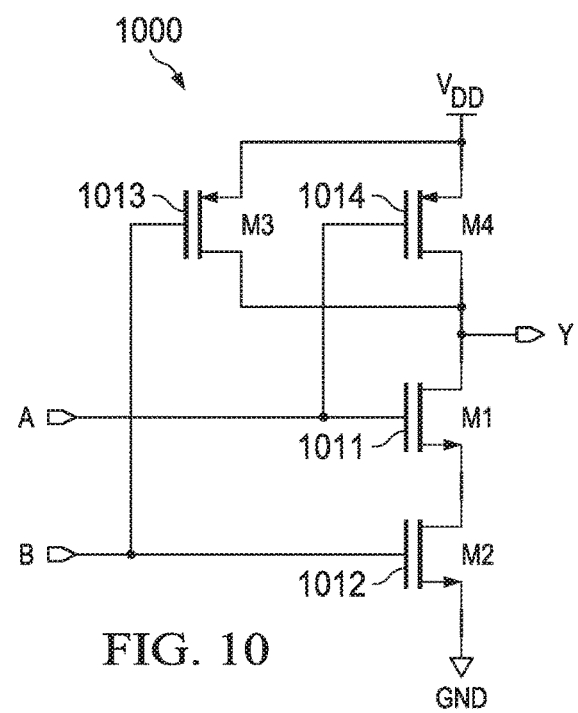
FIG. 10 is a schematic diagram of a NAND gate circuit according to an embodiment of the disclosure.

FIG. 10 is a schematic diagram of a NAND gate circuit 1000 according to an embodiment of the disclosure. The NAND module 650 may employ the circuit 1000 to implement a NAND operation. The circuit 1000 comprises two NMOS transistors 1011 and 1012, shown as M1 and M2, respectively, and two PMOS transistors 1013 and 1014, shown as M3 and M4, respectively. The source of the NMOS transistor 1011 is connected to the drain of the NMOS transistor 1012. The source of the NMOS transistor 1012 is connected to ground, shown as GND. The gates of the NMOS transistors 1011 and 1012 are connected to a pair of inputs A and B, respectively. The drains of the PMOS transistors 1013 and 1014 are connected to the drain of the NMOS transistor 1011, which is the output of the NAND circuit 1000, show as Y. The sources of the PMOS transistors 1013 and 1014 are connected to a power supply voltage, shown as $V_{DD}$. The gates of the PMOS transistors 1014 and 1013 are connected to the pair of inputs A and B, respectively. The NMOS transistors 1011 and 1012 operate as a pull-down network, where the output Y is low when both the inputs A and B are low. The PMOS transistors 1013 and 1014 operate as a pull-up network, where the output Y is high when either the input A or the input B is low.

Figure 11:
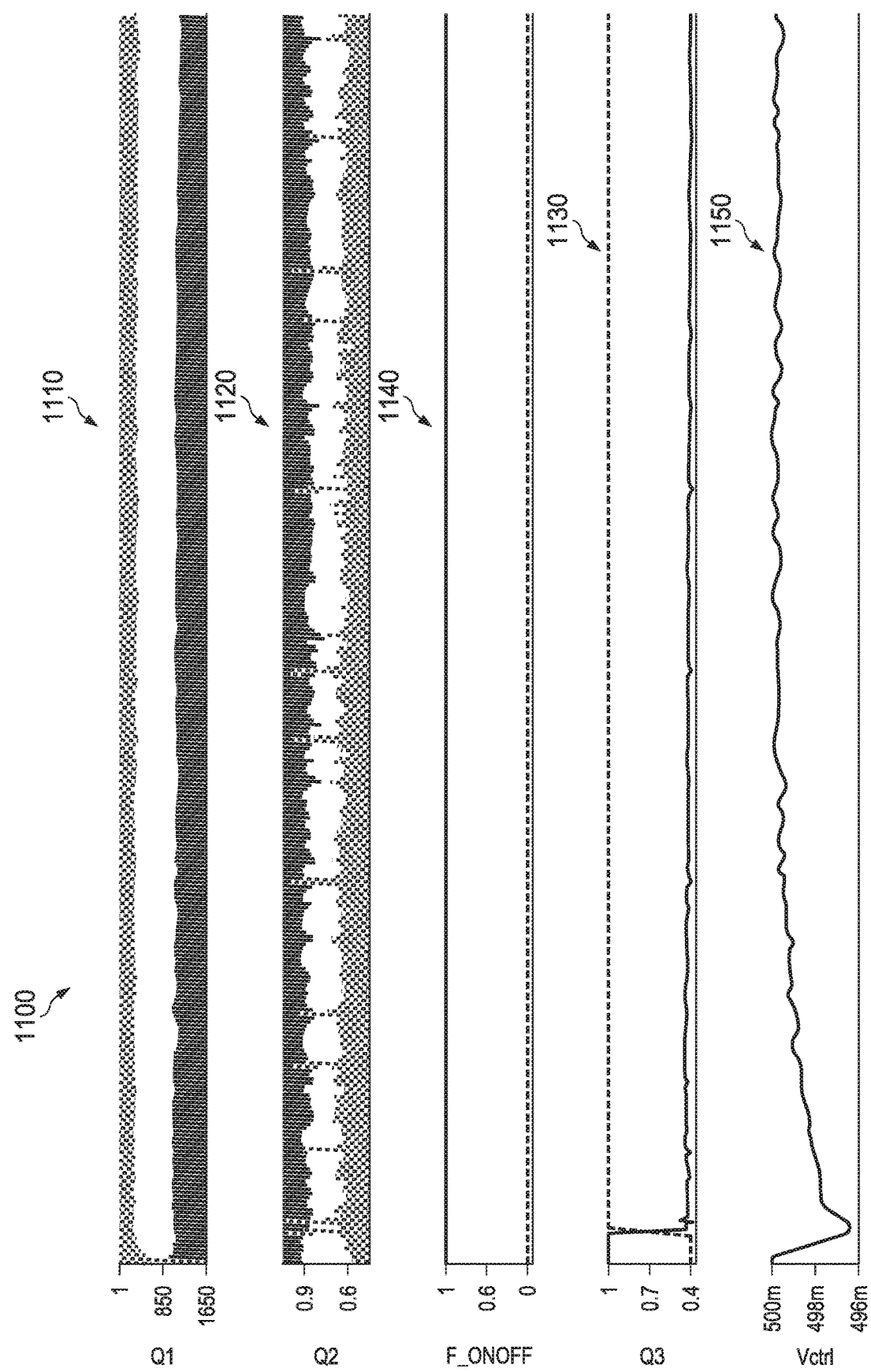
FIG. 11 is a graph illustrating captured waveforms of the jitter-tolerant, reference-less frequency detector of FIG. 5 while experiencing jitter according to an embodiment of the disclosure.

FIG. 11 is a graph 1100 illustrating captured waveforms of the jitter-tolerant, reference-less frequency detector 500 according to an embodiment of the disclosure. In the graph 1100, the x-axis represents time in some constant units, and the y-axis represents signal amplitude in units of voltages. The graph 1100 is generated by implementing the frequency detector according to the scheme 600. In the graph 1100, the solid curves correspond to the positive differential signal components and the dotted curves correspond to the negative differential signal components. The waveforms $Q_1$ 1110 shows the signals Q1M and Q1P captured at the output of the DFF module 611. The waveforms $Q_2$ 1120 shows the signals Q2M and Q2P captured at the output of the DFF module 612. The waveforms $Q_3$ 1130 shows the signals Q3M and Q3P captured at the output of the DFF module 613. The waveforms F_ONOFF 1140 shows the signals F_ONOFFM and F_ONOFFP captured at the outputs of the inverter module 670 and the buffer module 660, respectively. The waveform $V_{CTRL}$ 1150 shows a control voltage signal produced by a loop filter controlled by the V2I module 630. The control voltage signal is employed for adjusting the frequency of a VCO that produces the clock signal CKM and CKP in the scheme 600. As shown, the solid curve in waveform F_ONOFF 1140 corresponding to the signal F_ONOFFP remains at a logic high level instead of switching to a logic level low when the signals in the waveform $Q_2$ 1120 toggles due to jitter. Comparing the waveform $V_{CTRL}$ 340 to the waveform $V_{CTRL}$ 1150, the $V_{CTRL}$ signal in the waveform $V_{CTRL}$ 1150 is stable instead of varying as in the waveform $V_{CTRL}$ 340.

Figure 12:
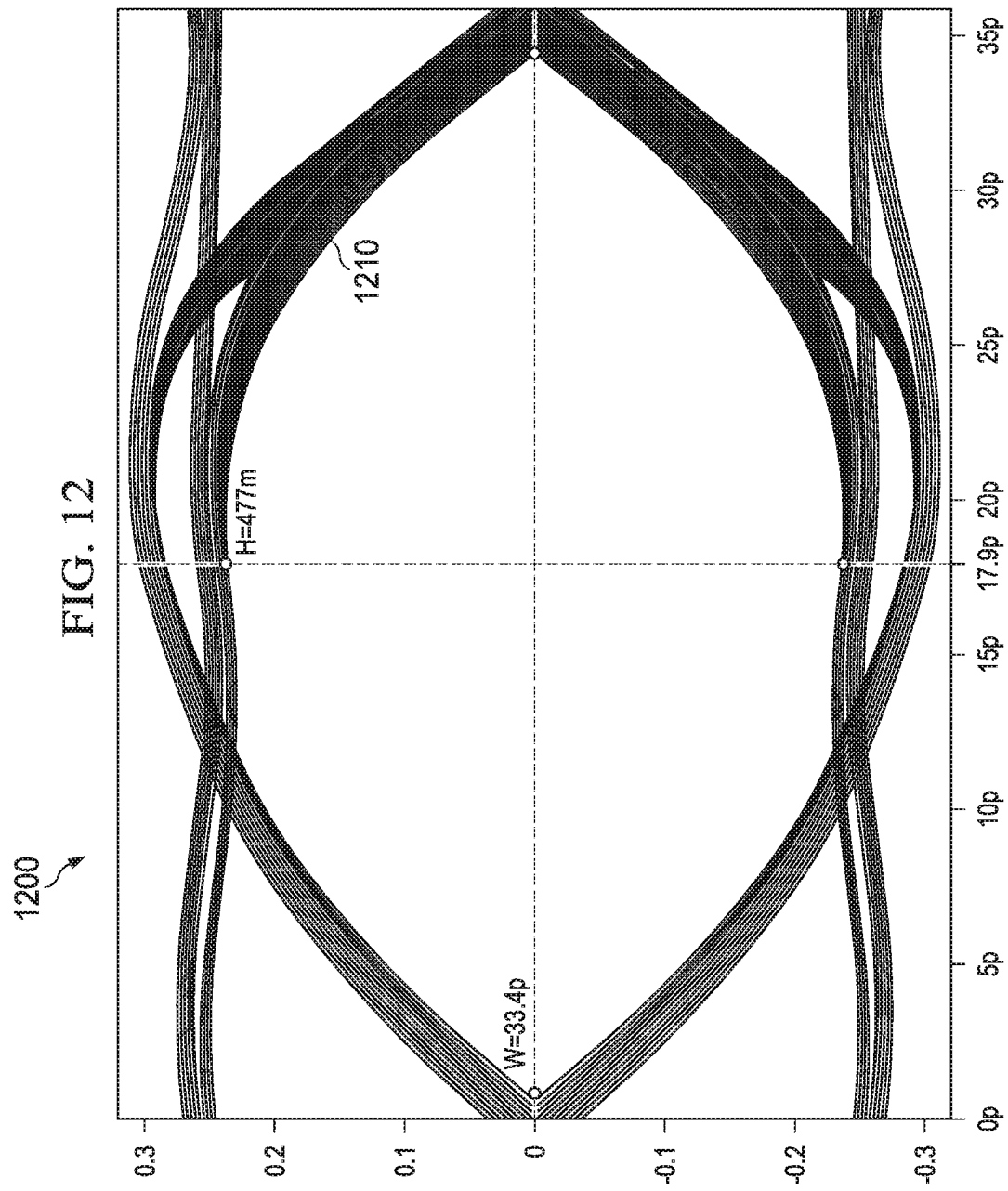
FIG. 12 is a graph illustrating a captured eye diagram of the jitter-tolerant, reference-less frequency detector of FIG. 5 while experiencing jitter according to an embodiment of the disclosure.

FIG. 12 is a graph 1200 illustrating a captured eye diagram 1210 of the jitter-tolerant, reference-less frequency detector 500 while experiencing jitter. In the graph 1200, the x-axis represent time in some constant units, and the y-axis represents signal amplitude in some constant units. The eye diagram 1210 corresponds to a data signal re-timed by the frequency detector 500 while experiencing jitter. Comparing the eye diagram 410 to the eye diagram 1210, the eye diagram 1210 is opened, while the eye diagram 410 is closed.

Figure 13:
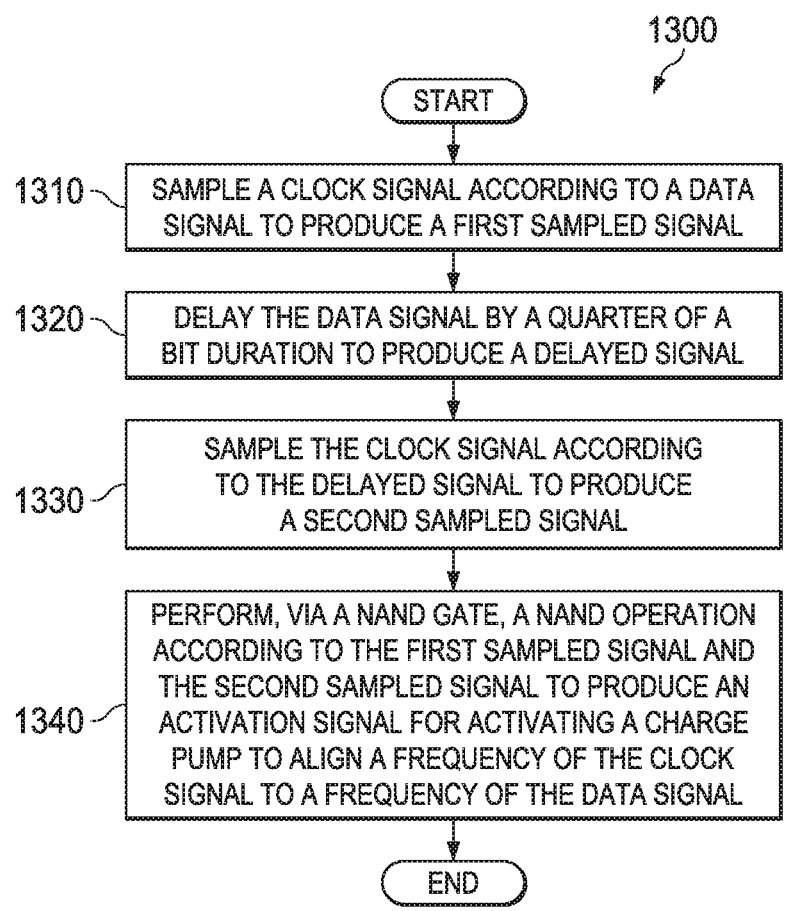
FIG. 13 is a flowchart of a method for performing reference-less frequency detection while experiencing jitter according to an embodiment of the disclosure.

FIG. 13 is a flowchart of a method 1300 for performing reference-less frequency detection while experiencing jitter according to an embodiment of the disclosure. The method 1300 is employed by a frequency detector such as the frequency detector 500, which may be a part of a CDR circuit. The method 1300 employs similar mechanisms as the frequency detector 500 and the scheme 600. At step 1310, a clock signal is sampled according to a data signal to produce a first sampled signal. For example, a first D flip-flop such as the DFFs 111, 112, 113, 511, 512, and 513 or the DFF modules 611, 612, and 613 may be employed to sample the clock signal. At step 1320, the data signal is delayed by a quarter of a bit duration to produce a delay signal. For example, a buffer similar to the delay buffers 120 and 520, the buffer module 660, and the buffer circuit 800 may be employed to delay the data signal. At step 1330, the clock signal is sampled according to the delayed signal to produce a second sampled signal. At step 1340, a NAND operation is performed according to the first sampled signal and the second sampled signal to produce an activation signal. The activation signal is employed for activating a charge pump to align a frequency of the clock signal to a frequency of the data signal. For example, a NAND gate such as the NAND gate 540, the NAND module 650, and the NAND circuit 700 may be employed to perform the NAND operation. In order to generate the activation signal such that the charge pump is activated only when the first sampled signal is at a logic state of 1 and the second sampled signal is at a logic state of 0, the NAND gate receives the first sampled signal and an inverse of the second sampled signal as inputs. The output of the NAND gate is as shown in Table 1 described above.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
    a not-and (NAND) gate comprising a first NAND gate input port, a second NAND gate input port, and a NAND gate output port;
    a charge pump comprising a charge pump activation port and a charge pump output current port, the charge pump activation port is coupled to the NAND gate output port, and the charge pump output current port is configured to couple to a frequency detection loop filter;
    an inverter module coupled to the NAND gate and the charge pump so that the inverter module is positioned between the NAND gate and the charge pump; and
    a buffer module coupled to the NAND gate and the charge pump so that the buffer module is positioned between the NAND gate and the charge pump,
    the buffer module is configured to buffer or delay a signal by a period of time.

2. The apparatus of claim 1, further comprising:
    a first D-type flip-flop (DFF) comprising a first DFF data input port, a first DFF clock input port, and a first DFF output port coupled to the first NAND gate input port; and
    a second DFF comprising a second DFF data input port, a second DFF clock input port, and a second DFF output port coupled to the second NAND gate input port.

3. The apparatus of claim 2, further comprising:
    a first current-mode logic-to-complementary metal-oxide semiconductor (CML-to- CMOS) converter comprising a first differential input port and a first differential output port comprising a first positive terminal and a first negative terminal; and
    a second CML-to-CMOS converter comprising a second differential input port and a second differential output port comprising a second positive terminal and a second negative terminal,
    wherein the first differential input port is coupled to the first DFF output port,
    wherein the second differential input port is coupled to the second DFF output port,
    wherein the first positive terminal of the first differential output port is coupled to the first NAND gate input port, and
    wherein the second negative terminal of the second differential output port is coupled to the second NAND gate input port.

4. The apparatus of claim 3, further comprising:
    an inverter comprising an inverter input port and an inverter output port; and
    a buffer comprising a buffer input port and a buffer output port,
    wherein the charge pump activation port is a differential port comprising a positive activation terminal and a negative activation terminal,
    wherein the inverter input port is coupled to the NAND gate output port,
    wherein the inverter output port is coupled to the positive activation terminal,
    wherein the buffer input port is coupled to the NAND gate output port, and
    wherein the buffer output port is coupled to the negative activation terminal.

5. The apparatus of claim 4, wherein the first CML-to-CMOS converter, the second CML-to-CMOS converter, the NAND gate, the buffer, and the inverter comprise p- channel metal-oxide semiconductor (PMOS) transistors and n-channel metal-oxide semiconductor (NMOS) transistors.

6. The apparatus of claim 1, wherein the NAND gate is the only NAND gate coupled to the charge pump.

7. An apparatus comprising:
    a not-and (NAND) gate comprising a first NAND gate input port, a second NAND gate input port, and a NAND gate output port;

a first D-type flip-flop (DFF) comprising a first DFF data input port, a first DFF clock input port, and a first DFF output port coupled to the first NAND gate input port;

a second DFF comprising a second DFF data input port, a second DFF clock input port, and a second DFF output port coupled to the second NAND gate input port;

a third DFF comprising a third DFF data input port coupled to the first DFF output port, a third DFF clock input port coupled to the second DFF output port, and a third DFF output port; and a charge pump comprising a charge pump current adjustment port coupled to the third DFF output port, a charge pump activation port coupled to the NAND gate output port, a charge pump output current port configured to couple to a frequency detection loop filter.

8. A method comprising:
receiving a first level-shifted signal and a second level-shifted signal;
implementing a not-and (NAND) of the first level-shifted signal and the second level-shifted signal to produce a NAND output signal;
inverting a first polarity of the NAND output signal to produce an inverted output signal;
buffering the NAND output signal for a period of time to produce a buffered output signal;
producing a current signal when the buffered output signal is at a logic high level; and
driving a loop filter based on the current signal.

9. The method of claim 8, further comprising controlling a frequency of a voltage-controlled oscillator (VCO) utilizing the loop filter.

10. The method of claim 8, further comprising:
sampling a clock signal according to a data signal to produce a first sampled signal;
delaying the data signal to produce a delayed signal; and
sampling the clock signal according to the delayed signal to produce a second sampled signal.

11. The method of claim 10, further comprising sampling the first sampled signal according to the second sampled signal to produce an error signal indicating a second polarity of a frequency difference between the data signal and the clock signal.

12. The method of claim 11, further comprising controlling a magnitude of the current signal based on the error signal.

13. The method of claim 8, wherein a NAND component performs the receiving and the implementing, an inverter component performs the inverting, a buffer component performs the buffering, and a charge pump component performs the producing and the driving.

14. The method of claim 8, further comprising:
forming a differential pair with the inverted output signal and the buffered output signal; and
activating or deactivating a charge pump module based on the differential pair.

15. An apparatus comprising:
a not-and (NAND) gate comprising:
a first NAND gate input port,
a second NAND gate input port, and
a NAND gate output port;
a charge pump comprising:
a charge pump activation port coupled to the NAND gate output port, and
a charge pump output current port;
a frequency detection loop filter coupled to the charge pump output current port;

an inverter module coupled to the NAND gate and the charge pump so that the inverter module is positioned between the NAND gate and the charge pump; and a buffer module coupled to the NAND gate and the charge pump so that the buffer module is positioned between the NAND gate and the charge pump.

16. The apparatus of claim 15, further comprising:
a first D-type flip-flop (DFF) comprising:
a first DFF data input port,
a first DFF clock input port, and
a first DFF output port coupled to the first NAND gate input port; and
a second DFF comprising:
a second DFF data input port,
a second DFF clock input port, and
a second DFF output port coupled to the second NAND gate input port.

17. The apparatus of claim 16, wherein the charge pump further comprises a charge pump current adjustment port.

18. The apparatus of claim 17, further comprising a third DFF comprising:
a third DFF data input port coupled to the first DFF output port,
a third DFF clock input port coupled to the second DFF output port, and
a third DFF output port coupled to the charge pump current adjustment port.

19. The apparatus of claim 16, further comprising:
a first current-mode logic-to-complementary metal-oxide semiconductor (CML-to- CMOS) converter comprising:
a first differential input port coupled to the first DFF output port, and
a first differential output port comprising:
a first positive terminal coupled to the first NAND gate input port, and
a first negative terminal; and
a second CML-to-CMOS converter comprising:
a second differential input port coupled to the second DFF output port, and
a second differential output port comprising:
a second positive terminal, and
a second negative terminal coupled to the second NAND gate input port.

20. The apparatus of claim 19, wherein the charge pump activation port is a differential port comprising a positive activation terminal and a negative activation terminal.

21. The apparatus of claim 20,
wherein the inverter module comprises:
an inverter input port coupled to the NAND gate output port, and
an inverter output port coupled to the positive activation terminal, and
wherein the buffer module comprises:
a buffer input port coupled to the NAND gate output port, and
a buffer output port coupled to the negative activation terminal.

22. The apparatus of claim 21, wherein the first CML-to-CMOS converter, the second CML-to-CMOS converter, the NAND gate, the buffer module, and the inverter module comprise p-channel metal-oxide semiconductor (PMOS) transistors and re- channel metal-oxide semiconductor (NMOS) transistors.

* * * * *

UNITED STATES PATENT AND TRADEMARK OFFICE
CERTIFICATE OF CORRECTION

PATENT NO. : 10,461,757 B2
APPLICATION NO. : 15/394364
DATED : October 29, 2019
INVENTOR(S) : Liang Gu et al.

Page 1 of 1

It is certified that error appears in the above-identified patent and that said Letters Patent is hereby corrected as shown below:

In the Claims

Column 14, Lines 61-66, Claim 22, should read:
22. The apparatus of claim 21, wherein the first CML-to-CMOS converter, the second CML-to-CMOS converter, the NAND gate, the buffer module, and the inverter module comprise p-channel metal-oxide semiconductor (PMOS) transistors and n-channel metal-oxide semiconductor (NMOS) transistors.

Signed and Sealed this
Twenty-fourth Day of December, 2019

Andrei Iancu
*Director of the United States Patent and Trademark Office*